United States Patent [19]

Tanaka

[11] Patent Number: 5,294,882
[45] Date of Patent: Mar. 15, 1994

[54] INTEGRATED CIRCUIT CAPABLE OF TESTING RELIABILITY

[75] Inventor: Junji Tanaka, Sakurai, Japan

[73] Assignee: Sharp Kabushiki Kaisha, Osaka, Japan

[21] Appl. No.: 920,659

[22] Filed: Jul. 28, 1992

[51] Int. Cl.$^5$ ............................................. G01R 15/12
[52] U.S. Cl. ............................. 324/158 R; 324/73.1
[58] Field of Search ............. 324/73.1, 158 R, 158 T, 324/25.1; 395/400; 371/15.1, 25.1, 16.1, 22.3, 22.6; 437/8; 257/48

[56] References Cited

U.S. PATENT DOCUMENTS

| | | | |
|---|---|---|---|
| 4,253,059 | 2/1981 | Bell et al. | 324/158 R |
| 4,336,495 | 6/1982 | Hapke | 324/158 R |
| 4,918,379 | 4/1990 | Jongepier | 324/73.1 |
| 4,918,385 | 4/1990 | Shreeve | 371/22.6 |
| 5,019,772 | 5/1991 | Dreibelbis et al. | 324/158 R |
| 5,036,272 | 7/1991 | Cho et al. | 324/158 R |
| 5,161,159 | 11/1992 | McClure et al. | 324/158 R |

FOREIGN PATENT DOCUMENTS 61-17752 2/1986 Japan.
64-29941 1/1989 Japan.
1-112181 4/1989 Japan.

Primary Examiner—Vinh Nguyen

[57] ABSTRACT

An integrated circuit having a predetermined function includes a signal generating circuit for generating a signal for performing a reliability test predetermined in the integrated circuit, a detecting circuit for outputting a signal which indicates a detection at a time when a rise of a supply voltage to the integrated circuit is detected, and a control circuit for controlling the integrated circuit so that a predetermined reliability test of the integrated circuit is performed by using the signal output from the signal generating circuit in case that a predetermined selection signal is applied to an input terminal of the control circuit in response to the signal output from the detecting circuit at a time of a rise of the supply voltage.

7 Claims, 3 Drawing Sheets

INTEGRATED CIRCUIT CAPABLE OF TESTING RELIABILITY

BACKGROUND OF THE INVENTION

1. Field of the Invention

The present invention relates to an integrated circuit which provides a reliability-testing function such as a burn-in operation.

2. Description of the Related Art

The inventors of the present invention know that a burn-in test of an integrated circuit is performed in order to selectively remove an initial defective circuit item after manufacture.

The inventors know an integrated circuit test which is intended to bring the integrated circuit into a predetermined operating state and to make an unstable component of the integrated circuit obvious for removal in intensified conditions. This test thus makes a contribution to enhancing the reliability of the integrated circuit.

For the above-mentioned test, it is requested that the integrated circuit is connected to not only a d.c. (direct current) power supply but also a start signal source and a clock signal source, as well.

A supply voltage of the d.c. power supply is applied between a $V_{DD}$ terminal and a GND (Ground) terminal. A start signal of the start signal source is applied between a start input terminal and the GND terminal. A clock signal of the clock signal source is applied between a clock input terminal and the GND terminal.

By providing the start signal, the integrated circuit operates in a predetermined manner as being synchronized with the clock signal. When performing the burn-in test, in response to a test signal supplied to a start signal source, the integrated circuit is allowed to iteratively perform a series of predetermined testing operations. The integrated circuit provides lots of I/O (input-/output) terminals including the terminals mentioned above. A testing signal may be often applied to the other terminals except them. Further, such a burn-in test is required to be performed about a relatively large number of integrated circuit items at a time. It means that the start signal source and the clock signal source have to supply signals to a large number of integrated circuits at a time. In a case that another input signal is needed, it is necessary to provide another signal source.

In the known burn-in test for an integrated circuit, as mentioned above, several kinds of signals are required to be supplied to the input terminals provided in the integrated circuit. When performing the burn-in test, since the test is conditioned at a high temperature and for a constant time, the integrated circuit is accommodated in a thermostatic chamber. The d.c. power supply and the other signal sources are located out of the thermostatic chamber so that those sources may be connected to the integrated circuit through conductive lines.

For connecting the integrated circuit to those conductive lines leading to sources, it is necessary to take a very troublesome operation.

SUMMARY OF THE INVENTION

It is an object of the present invention to provide an integrated circuit which is capable of easily performing a burn-in test.

The object of the present invention can be achieved by an integrated circuit having a predetermined function includes a signal generating circuit for generating a signal for performing a reliability test predetermined in the integrated circuit, a detecting circuit for outputting a signal which indicates a detection at a time when a rise of a supply voltage to the integrated circuit is detected, and a control circuit for controlling the integrated circuit so that a predetermined reliability test of the integrated circuit is performed by using the signal output from the signal generating circuit in case that a predetermined selection signal is applied to an input terminal of the control circuit in response to the signal output from the detecting circuit at a time of a rise of the supply voltage.

Preferably, the control circuit is further capable of controlling the integrated circuit so that the integrated circuit performs a normal operation according to the predetermined function thereof in case that no predetermined selection signal is applied to the input terminal.

More preferably, the control circuit includes a logic circuit for sequentially supplying a signal and a shift circuit connected to the logic circuit for receiving the signal output from the logic circuit and for shifting the received signal in synchronous to a shift clock output from the logic circuit.

The signal generating circuit is preferably a clock generator for generating a clock signal on which the shift circuit is operated.

The control circuit further preferably includes a starting circuit which generates a start signal.

The detecting circuit is preferably adapted to detect the rise of the supply voltage at a time when the start signal output from the starting circuit is applied to the integrated circuit for starting a burn-in test.

The control circuit preferably further includes a first selecting circuit connected to the logic circuit for supplying an output of the starting circuit into the logic circuit and a second selecting circuit connected to the logic circuit for supplying an output of the clock generator into the logic circuit, respectively.

In operation, the integrated circuit according to the first aspect of the invention includes the signal generating circuit and the control circuit having one or more input terminals. The signal generating circuit generates such a signal as operating the integrated circuit itself in a predetermined manner for testing its reliability. The detecting circuit detects a rise of a supply voltage. If a predetermined selection signal is applied onto the input terminal of the control circuit, at a leading edge of the supply voltage, the control circuit operates to test the reliability of the integrated circuit itself on the basis of the signal sent from the signal generating circuit. If no selection signal is applied onto the input terminal of the control circuit, the control circuit operates as one component of the integrated circuit. Merely by supplying the selection signal to the input terminal, therefore, the integrated circuit is capable of performing a testing operation. This makes contribution to reducing the number of necessary wires needed for a reliability test such as the burn-in test.

The object of the present invention can be also achieved by an integrated circuit having a shift register and to be operated on a signal being shifted in the shift register according to a clock signal includes a signal generating circuit for generating the clock signal, a detecting circuit for outputting a signal which indicates a detection at a time when a rise of a supply voltage to the integrated circuit is detected, and a control circuit for controlling the integrated circuit so that a cyclic operation of the integrated circuit for a reliability test is performed by applying the clock signal output from the signal generating circuit to the shift register and outputting from a final stage of the shift register to a first stage of the shift register in case that a predetermined terminal voltage is applied to an input terminal of the control circuit in response to the signal output from the detecting circuit at a time of a rise of the supply voltage.

Preferably, the control circuit is further capable of controlling the integrated circuit so that the cyclic operation for the reliability test is not performed in case that no predetermined terminal voltage is applied to the input terminal in response to the signal output from the detecting circuit at a time of a rise of the supply voltage.

More preferably, a plurality of the integrated circuits are mounted on a tape carrier package, a connection terminal to a power supply and the input terminal are pulled out to at least one end of the tape carrier package and are connected to each other for each of the integrated circuits.

Further preferably, after terminating the reliability test the connection terminal of each integrated circuit is disconnected from the input terminal, and an operation test of each integrated circuit is performed with a plurality of the integrated circuits being mounted on the tape carrier package.

In operation, the integrated circuit operates on pulse signals being shifted from stage to stage in the shift register on the clock signal. The signal generating circuit serves to generate the clock signal. The detecting circuit detects a rise of a supply voltage. If a predetermined supply voltage is applied to the input terminal at the rise of the supply voltage, the control circuit operates to supply the clock signal to the shift register so that the shift register may operate in a predetermined testing manner. If no predetermined supply voltage is applied to the input terminal, the control circuit does not operate to test the reliability of the integrated circuit. The operation for testing the reliability is cyclically carried out by applying an output from the final stage of the shift register into an input of the first stage. For applying the predetermined supply voltage into the input terminal, the input terminal is connected to the predetermined terminal of the power supply. This makes it possible to cyclically test the integrated circuit.

Further objects and advantages of the present invention will be apparent from the following description of the preferred embodiment of the invention as illustrated in the accompanying drawings.

DESCRIPTION OF THE PREFERRED EMBODIMENTS

Referring to the accompanying drawings, an preferred embodiment of an integrated circuit according to the present invention will be described.

Figure 1:
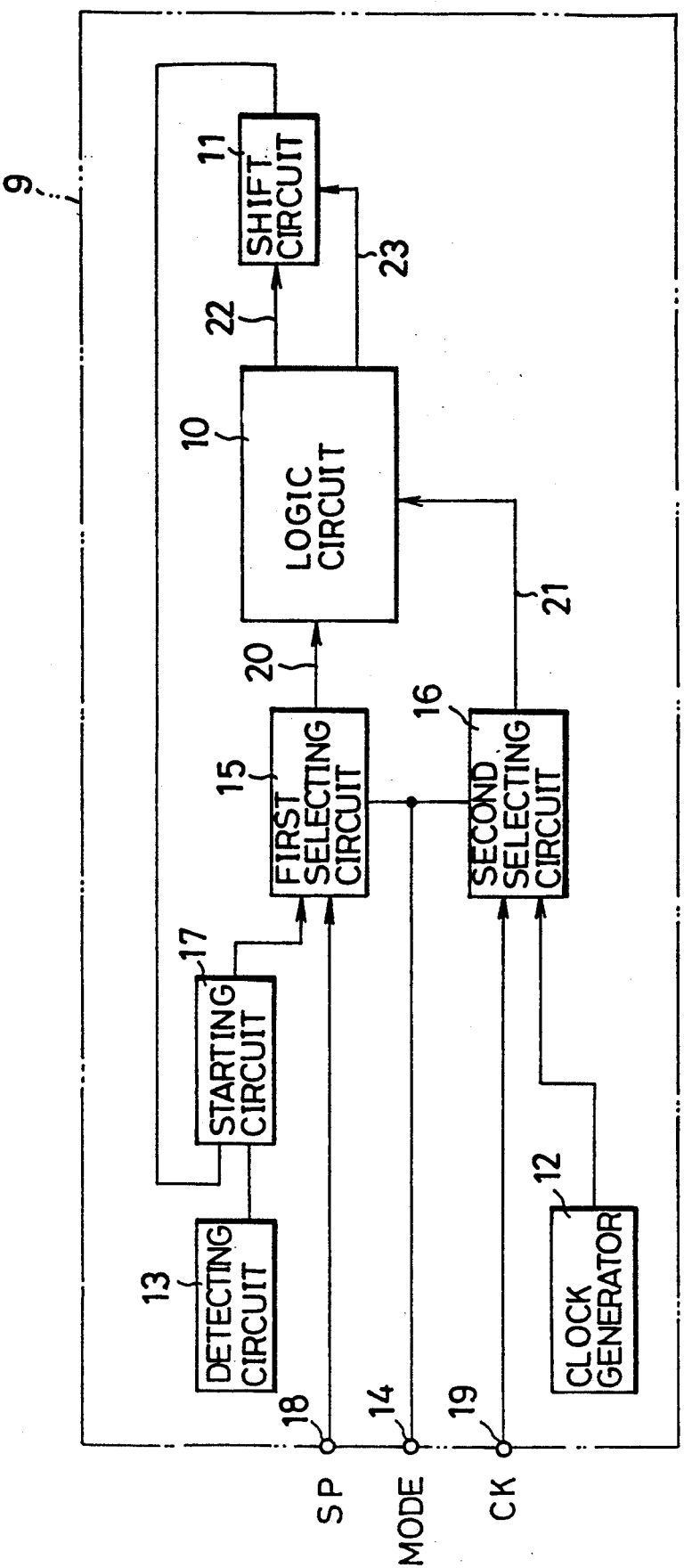
FIG. 1 is a block diagram showing an electric arrangement of an integrated circuit according to an embodiment of the present invention.

FIG. 1 schematically shows an electrical arrangement of an integrated circuit according to the present embodiment.

The integrated circuit shown in FIG. 1 may be used for driving a liquid crystal display element (hereinafter, it is referred to as LCD). This type of integrated circuit has been mounted on many kinds of electronic devices having an LCD such as a laptop computer and a LCD television. After mounting it to such an electronic device, it is very difficult to find out a defective integrated circuit. Therefore, in order to remove a defective circuit after manufacture, a burn-in test is performed. Such a semiconductor device as the integrated circuit shown in FIG. 1 is allowed to operate in a stable manner during a relatively long period if a defective circuit is removed at manufacture time.

The burn-in test is performed for bringing the integrated circuit into a predetermined operation with a supply voltage being applied thereto in predetermined conditions and during a constant period and making the defective function obvious in light of unstable elements.

After performing the burn-in test, the operation test for electric characteristics is performed on the basis of the product specifications of the integrated circuit. From the testing result, a defective circuit is removed.

The integrated circuit 9 as shown in FIG. 1, is monolithically formed on a substrate made of silicon.

The integrated circuit 9 includes a logic circuit 10, a shift circuit 11, a clock generator 12, a detecting circuit 13, a first selecting circuit 15, a second selecting circuit 16, a starting circuit 17.

The clock generator 12 serves to generate a clock signal on which the shift circuit 11 is operated at a time when the test is performed.

The detecting circuit 13 serves to detect a rise of a supply voltage at a time when a start signal is applied to the integrated circuit 9 itself for starting the burn-in test.

A mode-selecting signal (MODE) is applied to a selecting input terminal 14 for selecting the operations of the logic circuit 10 and the shift circuit 12, that is, whether those circuits are operated on a predetermined function or on the burn-in test.

The mode-selecting signal is supplied to the first selecting circuit 15 and the second selecting circuit 16, respectively.

The starting circuit 17 applies an output at one input of the first selecting circuit 15 and serves to apply an output of the detecting circuit 13 or a final stage of the shift circuit 11 into the first selecting circuit 15.

The clock generator 12 serves to apply a clock signal into one input of the selecting circuit 16.

The first selecting circuit 15 selects a start pulse (SP) or the output from the starting circuit 17 and the second selecting circuit 16 selects a clock signal (CK) or the output from the clock generator 12 in accordance with a signal supplied to a selecting input terminal (MODE) 14.

The first selecting circuit 15 supplies an output of the starting circuit 17 into the logic circuit 10 on line 20 and the second selecting circuit 16 supplies an output of the clock generator 12 into the logic circuit 10 on line 21, respectively, in case that a grounding potential, one level of the power supply, is applied to the selecting input terminal 14 by connecting the selecting input terminal 14 to the grounding potential of the power supply.

In case that the selection input terminal 14 is left open without being applied thereto, a predetermined potential is applied from the inside of the integrated circuit 9 into the selecting input terminal 14.

At this time, the signals applied at the starting input terminal 18 is selected by the first selecting circuit 15 and the clock input terminal 19 are selected by the second selecting circuit 16, respectively. Then, those selected signals are supplied to the logic circuit 10.

In response to the start signal on line 20, the logic circuit 10 starts to operate in synchronous to the clock signal sent on line 21.

The logic circuit 10 sequentially supplies a signal to a first stage of the shift circuit 11 on line 22. The signal is shifted in the shift circuit 11 in synchronous to a shift clock sent on line 23 from the logic circuit 10.

An output from a final stage of the shift circuit 11 is sent to the starting circuit 17. When performing the burn-in test, this signal is used as a start signal on which the logic circuit 10 is operated again, that is, within the integrated circuit 9 the cyclic operation is allowed to be done.

In order to generate a start signal with a long cycle for the burn-in test according to a signal output from the shift circuit 11 within the integrated circuit, a large-scale circuit is not required as the start circuit 17, and the built-in into the integrated circuit is easily performed.

Figure 2:
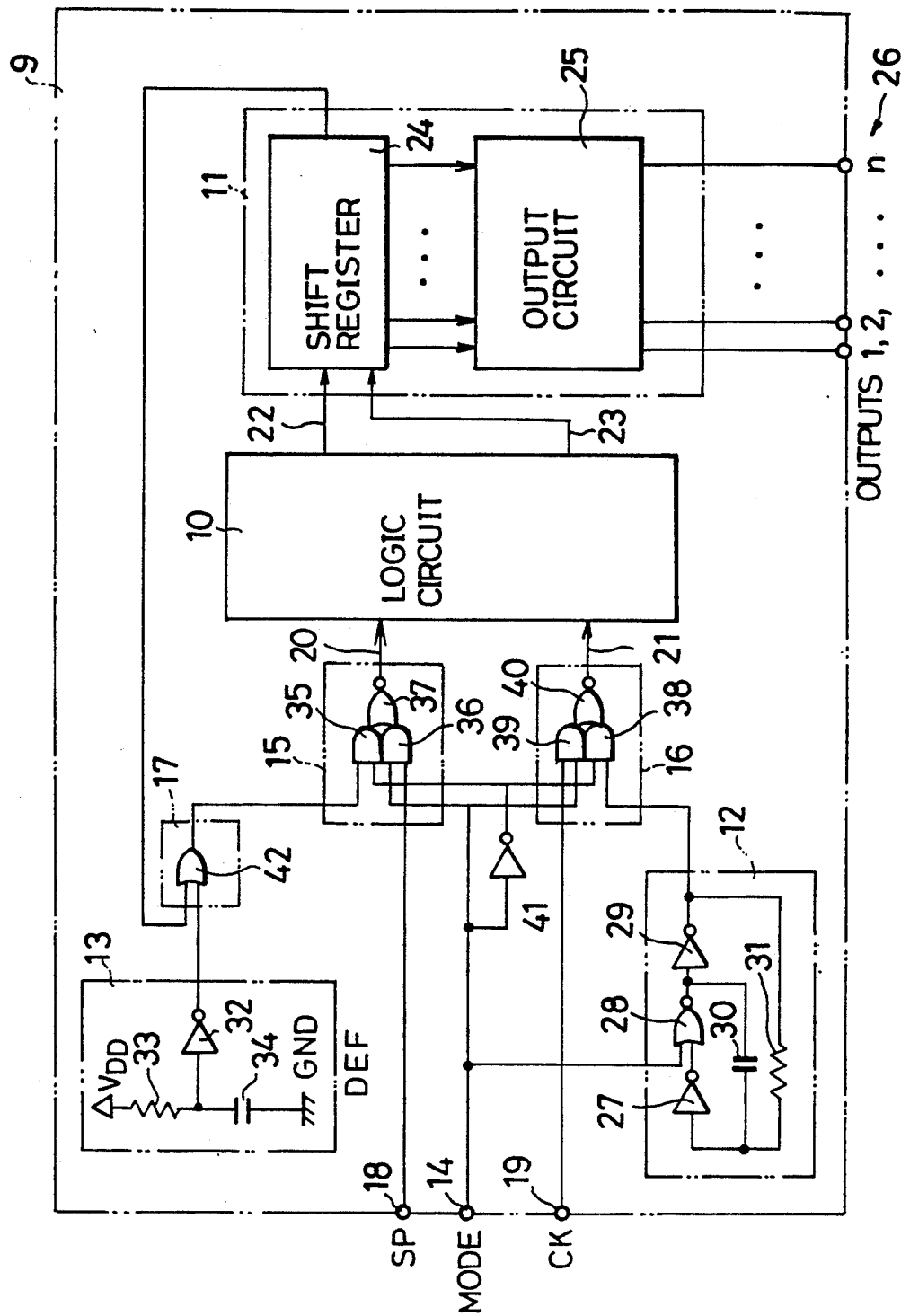
FIG. 2 is a block diagram showing a detailed electric arrangement of the integrated circuit shown in FIG. 1.

FIG. 2 shows an electric arrangement of the integrated circuit 9 shown in FIG. 1 with more details, in which the same components have the same reference numbers as those in FIG. 1.

The shift circuit 11 is arranged to have a shift register 24 and an output circuit 25.

The shift register 24 serves to receive a signal applied from the logic circuit 10 to its first stage on line 22 and sequentially shift the signal in synchronous to the shift clock signal given on line 23. The shift register 24 supplies an output from each stage to the output circuit 25, from which each output is guided out of the integrated circuit 9.

The shift clock signal is generated inside of the logic circuit 10 based on the clock signal generated in the clock generator 12.

The clock generator 12 has an oscillating circuit arranged to have an inverting circuit 27, an NOR circuit 28, an inverting circuit 29, a capacitor 30, and a resistor 31.

The mode-selecting signal is applied from the selecting input terminal 14 into one input of the NOR circuit 28 so that the oscillating circuit can operate at a low level of the mode-selecting signal.

The voltage detecting circuit 13 is arranged to have an inverting circuit 32, a resistor 33 and a capacitor 34. The series circuit composed of the resistor 33 and the capacitor 34 is connected between both terminals $V_{DD}$ and GND of the voltage supply. A contact between the resistor 33 and the capacitor 34 is connected to an input of the inverting circuit 32.

When a supply voltage is applied into the integrated circuit 9, the capacitor 34 is charged with the current passed through the resistor 33, so that the higher input voltage may be applied to the inverting circuit 32. Until the input voltage exceeds a threshold value of the inverting circuit 32, the output voltage of the inverting circuit 32 is at high level.

When the voltage exceeds the threshold value, the output voltage of the inverting circuit 32 is at low level. With this function, the detecting circuit 13 operates to output a high-level signal at a leading edge of the supply voltage but a low-level signal after the rise of the supply voltage.

The first selecting circuit 15 is arranged to have a first AND circuit 35, a second AND circuit 36, and a NOR circuit 37, and the second selecting circuit 16 is arranged to have a first AND circuit 38, a second AND circuit 39, and NOR circuits 40, respectively.

A signal at the selecting input terminal 14 is applied to each one input of the first AND circuits 35, 38 through an inverting circuit 41.

A signal at the selecting input terminal 14 is applied to each one input of the second AND circuits 36, 39.

The starting circuit 17 serves to apply an output signal into the other input of the first AND circuit 35. A signal at the starting input terminal 18 is applied into the other input of the second AND circuit 36 included in the first selecting circuit 15.

The clock generator 12 operates to send an output signal to the other input of the first AND circuit 38 included in the second selecting circuit 16.

In the first selecting circuit 15 and the second selecting circuit 38, 39 supply their outputs to the NOR circuits 37, 40, respectively.

The NOR circuit 37 of the first selecting circuit 15 sends an output signal to the logic circuit 10 on line 20. The NOR circuit 40 of the second selecting circuit 16 sends an output signal to the logic circuit 10 on line 21.

The starting circuit 17 contains an OR circuit 42. At one input of the OR circuit 42, the detecting circuit 13 applies an output signal. At the other input of the OR circuit 42, the final stage of the shift register 24 applies an output signal.

As such, the OR circuit 42 serves to apply an output of the detecting circuit 13 or an output of the final stage of the shift register 24 into the other end of the first AND circuit 35 included in the first selecting circuit 15.

Figure 3:
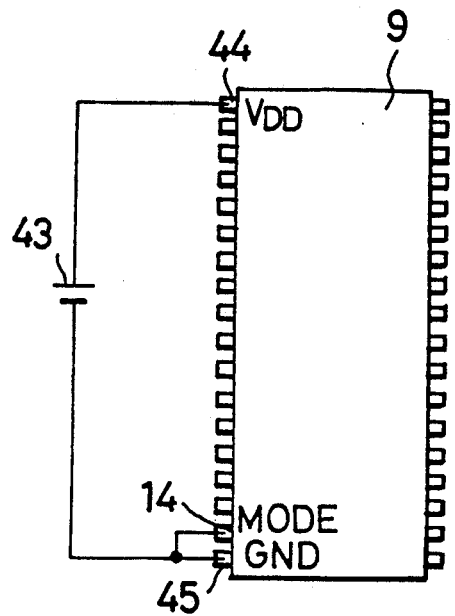
FIG. 3 is a view showing an electric connection of the integrated circuit arranged to perform a burn-in test.

FIG. 3 shows an electric connecting state required for performing a burn-in test against the integrated circuit 9 shown in FIG. 1.

The integrated circuit 9 is connected to a direct current (d.c.) power supply at the $V_{DD}$ terminal 44 and the GND terminal 45. The selecting input terminal 14 is connected to the GND terminal 45 as well as one terminal of the d.c. power supply 43. As shown, the selecting input terminal 14 is located adjacent to the GND terminal 45 for making the connection between the power supply 43 and the integrated circuit 9 easier.

Figure 4:
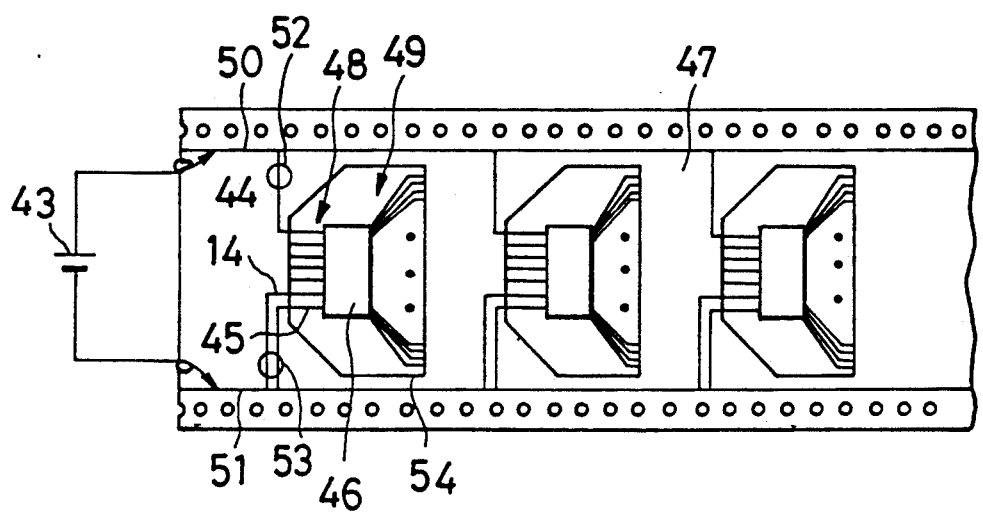
FIG. 4 is a view showing an electric connection of an integrated circuit according to another embodiment of the present invention.

FIG. 4 shows a connecting state in which a burn-in test is performed by using a plurality of the integrated circuits 46 according to another embodiment of the present invention.

The same components as those of the embodiment shown in FIGS. 1 and 2 have the same reference numbers. It should be noted that a plurality of integrated circuits 46 are mounted on a tape carrier package (abbreviated as TCP).

The tape carrier package is formed by pasting a copper foil on a base film made of a polyimide resin system material with an epoxy resin system adhesive agent, patterning the copper foil and performing an electroless plating of tin on the patterned result.

Each of the integrated circuits 46 includes an input terminal 48 and an output terminal 49 directed in respective directions.

On the input terminal 48, a $V_{DD}$ terminal 44 and a GND terminal 45, which are the supply voltage terminals, are included. The output of the d.c. power supply 43 is connected to a common $C_{DD}$ line 50 and a common GND line 51 provided on the tape carrier package 47.

The selecting input terminal 14 is connected to the GND line 51 serving as a predetermined power supply.

By applying a supply voltage from one end of the tape carrier package into the common lines 50 and 51, it is possible to efficiently and easily perform the burn-in test about a plurality of integrated circuits 46 mounted on the tape carrier package in batches.

On the termination of the burn-in test, with the integrated circuits 46 being mounted on the base film, the $V_{DD}$ terminal 44, the GND terminal 45, and the selecting input terminal 14 are disconnected from the common lines 50 and 51 by punching holes 52, 53.

After a separation, a test about an essential function for each of the integrated circuit 46 is performed (final test). Within this test, it is determined whether or not each integrated circuit 46 meets electric specifications.

As a result, the circuit which has been found defective by the burn-in test is allowed to be removed. After these tests are terminated, the tape carrier package 47 is cut along a cutting line 54 shown in FIG. 4 so as to separate each of the integrated circuits 46 from the package 47.

In the foregoing embodiments, the reliability test such as a burn-in test is performed about the integrated circuit 9 or 46 whose semiconductor chip is held in a package. The reliability test can be performed about a bare semiconductor chip or a wafer having the semiconductor chips as well, in a similar manner as mentioned in the above.

Many widely different embodiments of the present invention may be constructed without departing from the spirit and scope of the present invention. It should be understood that the present invention is not limited to the specific embodiments described in the specification, except as defined in the appended claims.

What is claimed is:

1. An integrated circuit adapted to perform a predetermined reliability test, comprising:
   a signal generating circuit for generating a signal for performing said predetermined reliability test in said integrated circuit;
   a detecting circuit for outputting a signal which indicates a detection at a time when a rise of a supply voltage to said integrated circuit is detected; and
   a control circuit connected to both said signal generating circuit and said detecting circuit and having a test mode setting terminal for controlling an operation of said predetermined reliability test of said integrated circuit,
   said integrated circuit being arranged to execute said predetermined reliability test thereof in accordance with said control circuit which is adapted to use said signal output from said signal generating circuit in case that a predetermined selection signal is applied to said test mode setting terminal in response to said signal output from said detecting circuit at a time of a rise of said supply voltage,
   said integrated circuit being further arranged to perform a normal operation in case that no predetermined selection signal is applied to said test mode setting terminal.

2. An integrated circuit according to claim 1, wherein said control circuit includes,
   a starting circuit connected to said detecting circuit for generating a start signal in accordance with said signal output from said detecting circuit,
   a first selecting circuit connected to said starting circuit for supplying said signal output from said starting circuit, and
   a second selecting circuit connected to said signal generating circuit for supplying said signal output from said signal generating circuit.

3. An integrated circuit according to claim 2, wherein said control circuit further includes,
   a logic circuit connected to both said first selecting circuit and said second selecting circuit for sequentially supplying a signal and for supplying a shift clock in accordance with said signals output from said first selecting circuit and said second selecting circuit, and
   a shift circuit connected to said logic circuit for receiving said signal output from said logic circuit and for shifting said received signal in synchronous to said shift clock output from said logic circuit.

4. An integrated circuit according to claim 3, wherein said signal generating circuit is a clock generator for generating a clock signal on which said shift circuit is operated, and said detecting circuit is adapted to detect said rise of said supply voltage at a time when said start signal output from said starting circuit is applied to said integrated circuit for starting a burnin test.

5. An integrated circuit having a shift register and to be operated on a signal being shifted in said shift register according to a clock signal, said integrated circuit comprising:
   a signal generating circuit for generating said clock signal,
   a detecting circuit for outputting a signal which indicates a detection at a time when a rise of a supply voltage to said integrated circuit is detected; and
   a control circuit connected to both signal generating circuit and said detecting circuit for controlling an operation of a reliability test of said integrated circuit,
   said integrated circuit being arranged that a cyclic operation of said integrated circuit for said reliability test thereof is performed by applying said clock signal output from said signal generating circuit to said shift register and for outputting a signal from a final stage of said shift register to a first stage of said shift register in case that a predetermined terminal voltage is applied to said control circuit in response to said signal output from said detecting circuit at a time of said rise of said supply voltage.

6. An integrated circuit according to claim 5, wherein said control circuit is further adapted to control an operation of said reliability test of said integrated circuit so that said cyclic operation for said reliability test is not performed in case that no predetermined terminal voltage is applied to said control circuit in response to said signal output from said detecting circuit at a time of said rise of said supply voltage.

7. An integrated circuit according to claim 6, wherein said integrated circuit is arranged in such a manner that a plurality of integrated circuits are formed to be mounted on a tape carrier package.

* * * * *